United States Patent
Guo et al.

(10) Patent No.: US 9,112,101 B2
(45) Date of Patent: Aug. 18, 2015

(54) LIGHT-EMITTING DEVICE MANUFACTURING METHOD

(71) Applicant: EPISTAR CORPORATION, Hsinchu (TW)

(72) Inventors: Yi-Lin Guo, Hsinchu (TW); Chen Ou, Hsinchu (TW); Chi-Ling Lee, Hsinchu (TW); Wei-Han Wang, Hsinchu (TW); Hui-Tang Shen, Hsinchu (TW); Chi-Hung Wu, Hsinchu (TW); Hung-Chih Yang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 14 days.

(21) Appl. No.: 13/870,008

(22) Filed: Apr. 25, 2013

(65) Prior Publication Data

US 2014/0319559 A1 Oct. 30, 2014

(51) Int. Cl.
*H01L 33/00* (2010.01)
*H01L 21/76* (2006.01)
*H01L 33/32* (2010.01)
*H01L 33/22* (2010.01)
*H01L 33/12* (2010.01)

(52) U.S. Cl.
CPC ............ *H01L 33/22* (2013.01); *H01L 33/0079* (2013.01); *H01L 33/12* (2013.01)

(58) Field of Classification Search
CPC ...... H01L 33/12; H01L 33/22; H01L 33/0079
USPC ........ 438/29, 46, 47, 478; 257/13, 94, 97, 98, 257/103, E33.006, E33.008, E33.023, 257/E33.028
See application file for complete search history.

(56) References Cited

U.S. PATENT DOCUMENTS

| | | | |
|---|---|---|---|
| 6,091,085 A | 7/2000 | Lester | |
| 7,777,241 B2 | 8/2010 | Moustakas et al. | |
| 8,193,069 B2 * | 6/2012 | Moriceau et al. | 438/455 |
| 2008/0277686 A1 * | 11/2008 | Tsai | 257/103 |
| 2010/0084679 A1 * | 4/2010 | Hsieh et al. | 257/98 |
| 2012/0058586 A1 | 3/2012 | Moustakas et al. | |
| 2014/0127848 A1 * | 5/2014 | CHO et al. | 438/47 |
| 2014/0225062 A1 * | 8/2014 | Weng | 257/13 |
| 2014/0231840 A1 * | 8/2014 | Fudeta et al. | 257/97 |

* cited by examiner

*Primary Examiner* — Dao H Nguyen
(74) *Attorney, Agent, or Firm* — Bacon & Thomas, PLLC

(57) ABSTRACT

A method for manufacturing a light-emitting device, comprises steps of: providing an as-cut wafer having an irregularly uneven surface comprising surface roughness greater than 0.5 μm; and forming a light-emitting stack on the irregularly uneven surface of the as-cut wafer by an epitaxial growth method, and the light-emitting stack comprises an upper surface having surface roughness less than 0.2 nm; wherein there is no patterning or roughing process after the step of providing the as-cut wafer and before the step of forming the light-emitting stack on the irregularly uneven surface of the as-cut wafer.

12 Claims, 4 Drawing Sheets

LIGHT-EMITTING DEVICE MANUFACTURING METHOD

TECHNICAL FIELD

The application relates to a light-emitting device manufacturing method, in particular, relates to a manufacturing method adopting an as-cut wafer as an epitaxial growth substrate for a light-emitting device.

DESCRIPTION OF BACKGROUND ART

The lighting theory and structure of light-emitting diode (LED) is different from that of conventional lighting source. An LED has advantages as a low power loss, a long life-time, no need for warming time, and fast responsive time. Moreover, it is small, shockproof, suitable for mass production, so LEDs are widely adopted in the market. For example, LEDs can be used in optical display apparatus, laser diodes, traffic lights, data storage devices, communication devices, illumination devices, medical devices, and so on.

A light-emitting device may include a substrate, a light-emitting stack including an n-type semiconductor layer, an active layer, and a p-type semiconductor layer. The light-emitting stack may have uneven structure thereon to enhance light extraction.

In addition, the light emitting device can be further connected to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connected to the electrode of the light-emitting device via an electrical conductive structure such as a metal wire.

SUMMARY OF THE DISCLOSURE

A light-emitting device includes: a light-emitting stack having an upper surface having a first surface roughness less than 0.2 nm; and an as-cut wafer comprising an irregularly uneven surface facing the light-emitting stack and having a second surface roughness greater than 0.5 μm.

A method for manufacturing a light-emitting device includes steps of: providing an as-cut wafer having an irregularly uneven surface comprising surface roughness greater than 0.5 μm; and forming a light-emitting stack on the irregularly uneven surface of the as-cut wafer by an epitaxial growth method, and the light-emitting stack comprises an upper surface having surface roughness less than 0.2 nm; wherein there is no patterning or roughing process after the step of providing the as-cut wafer and before the step of forming the light-emitting stack on the irregularly uneven surface of the as-cut wafer.

DETAILED DESCRIPTION OF PREFERRED EMBODIMENTS

Figure 1A:
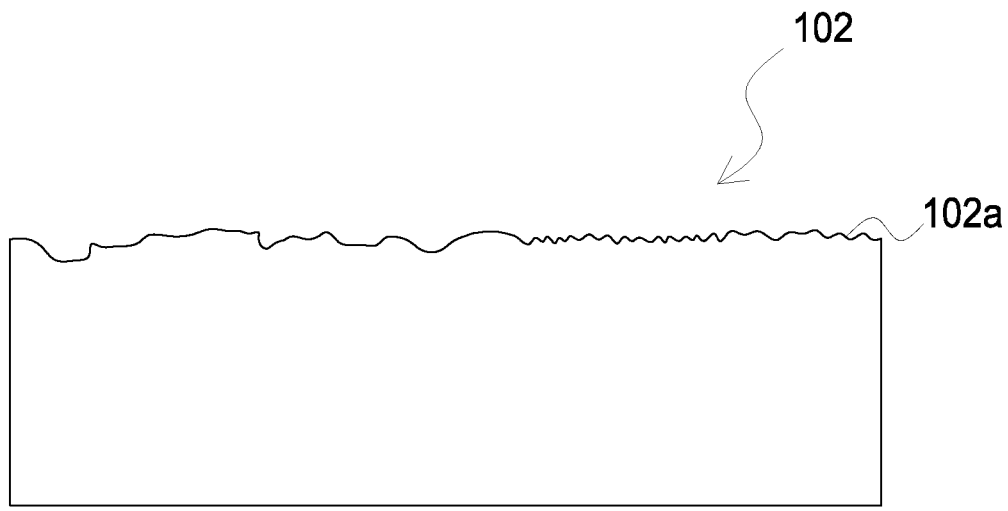
FIGS. 1A to 1C show a manufacturing method of a light-emitting device in accordance with a first embodiment of the present application.
Figure 1B:
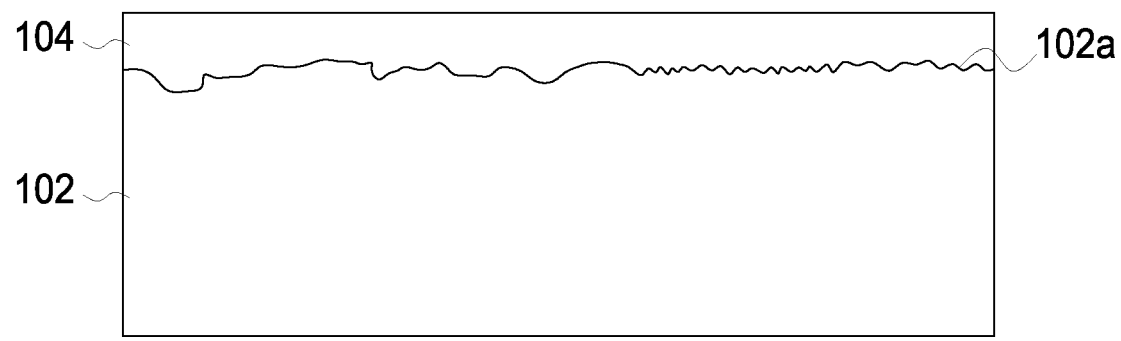
Figure 1C:
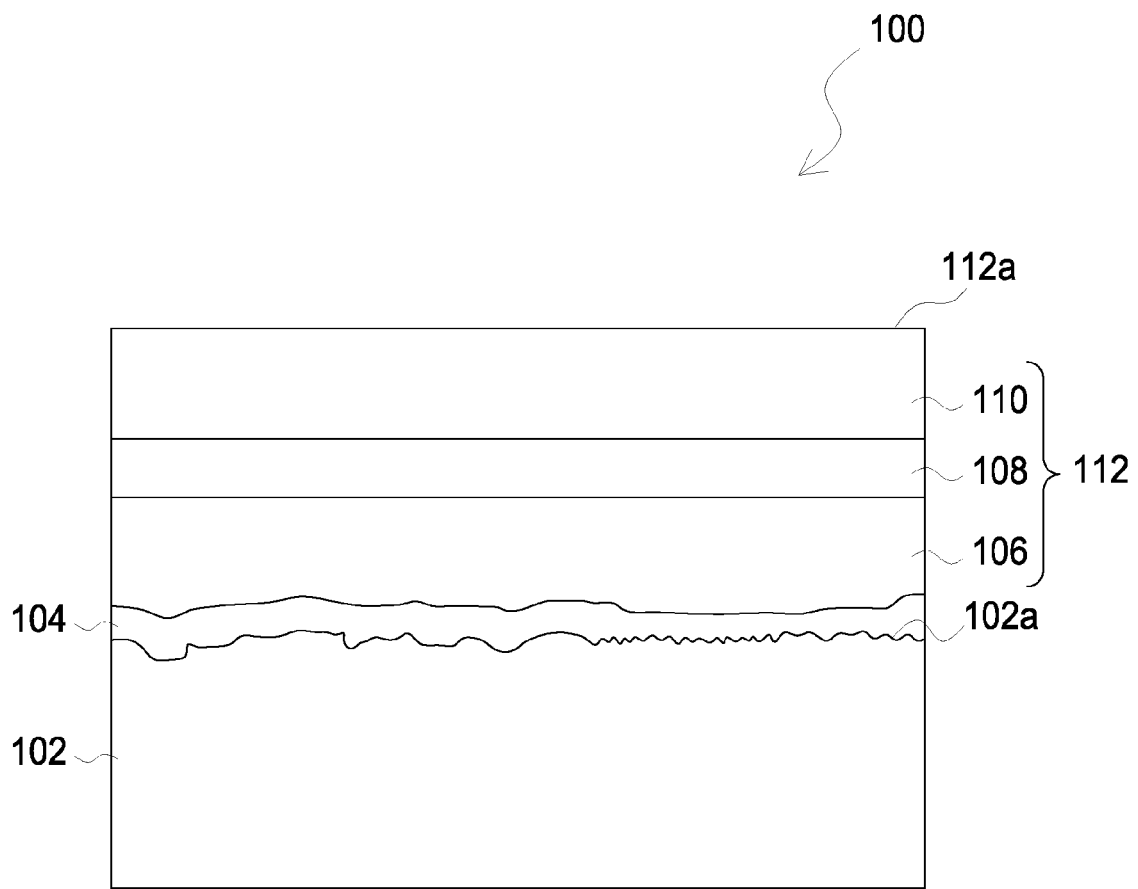

Referring to FIGS. 1A to 1C, a method for manufacturing a light-emitting device in accordance with a first embodiment of the present application is disclosed. As shown in FIG. 1A, a single crystalline wafer 102 for semiconductor epitaxial growth is provided, and the single crystalline wafer 102 can be an as-cut sapphire wafer. The single crystalline wafer 102 can be formed by following steps: A. a crystal growth process in accordance with Czochralski method or Kyropoulos method is applied for forming a raw crystal material, which can be sapphire in the embodiment; B. pulling a crystal ingot from the raw crystal material; C. cutting the crystal ingot to a plurality of wafers. D. Polishing the surface of each wafer to a predetermined surface roughness to form an as-cut wafer for manufacturing an optoelectronic device. In the embodiment, the as-cut wafer is used for manufacturing a light-emitting device. Preferably, a single crystalline wafer 102 has an irregularly uneven surface 102a for scattering the light of the light-emitting stack (not shown) epitaxial grown thereon, and the irregularly uneven surface 102a can include a surface roughness between 0.5 μm and 3 μm. Moreover, the surface roughness of the irregularly uneven surface 102a can be between 0.8 μm and 2 μm or 0.5 μm to 1 μm. The surface roughness is an arithmetical mean roughness calculated from a sectional length of 100 μm of the irregularly uneven surface 102a, and the sectional length can be defined as a continuous line within the area range of the irregularly uneven surface 102a. Conventionally, a sapphire wafer is polished to reach a surface roughness about 10 Å prior to epitaxially growing a light-emitting stack thereon and then the surface of the sapphire wafer is patterned by lithography process for light-extraction purpose. In the embodiment of present application, the irregularly uneven surface 102a of the single crystalline wafer 102 is formed when the process of cutting the crystal ingot to the plurality of as-cut wafers is performed wherein the surface roughness of the irregularly uneven surface 102a is sufficient to reflect light emitted from a light-emitting stack epitaxially grown thereon. Therefore, there is no need of additional patterning process, and the cost of forming the irregularly surface 102a in the embodiment of the present application is much less than that of the convention art.

As shown in FIG. 1B, a semiconductor buffer layer 104 can be formed on the uneven irregularly surface 102a by epitaxial growth. The semiconductor buffer layer 104 can include undoped GaN or un-intentionally doped GaN for reducing lattice mismatch between the single crystalline wafer 102 and a light-emitting stack (not shown), however, the buffer layer 104 can also include other undoped nitride-based semiconductor.

As shown in FIG. 1C, a light-emitting stack 112 is formed on the semiconductor buffer layer 104. The light-emitting stack 112 can be IIIA group nitride and includes: a first semiconductor layer 106 having a first conductivity formed on the semiconductor buffer layer 104, an active layer 108 formed on the first semiconductor layer 106, and a second semiconductor layer 110 having a second conductivity formed on the active layer 108. The first semiconductor layer 106 is different from the second semiconductor layer 110. For example, the first semiconductor layer 106 can be an n-type semiconductor layer and the second semiconductor layer 110 can be a p-type semiconductor layer. The electrons provided from the n-type semiconductor layer and the holes provided from the p-type semiconductor layer combine in the active layer 108 to emit light under an external electrical current driving. The first semiconductor layer 106, the active layer 108, and the second semiconductor layer 110 can be grown by a vapor carrying a group IIIA element and group VA element in an MOVCD chamber. Especially, the pressure in the MOVCD chamber can be gradually decreasing along with the duration of forming the first semiconductor layer 106, and the ratio of the group IIIA element to the group VA element in the vapor is gradually decreasing along the duration of forming the first semiconductor layer 106, and the temperature can be gradually increasing along with the duration of forming the first semiconductor layer 106. Accordingly the upper surface 112a of the light-emitting stack 112 can be approximately smooth by having a surface roughness less than 0.2 nm, and an interface between the first semiconductor layer 106 and the active layer 108 also has a roughness less than 0.2 nm. After the active layer 108 and the second semiconductor layer 110 are grown, a mesa process can be performed to remove a portion of the second semiconductor layer 110 and the active layer 108, therefore an region of the first semiconductor layer 106 is exposed, then two electrodes (not shown) can be formed on the first semiconductor layer 106 and the second semiconductor layer 110, respectively. The light-emitting stack 112 can receive a forward current through the electrodes, therefore the active layer 108 is activated to emit light, and the light can be reflected by the irregularly uneven surface 102a.

Figure 2:
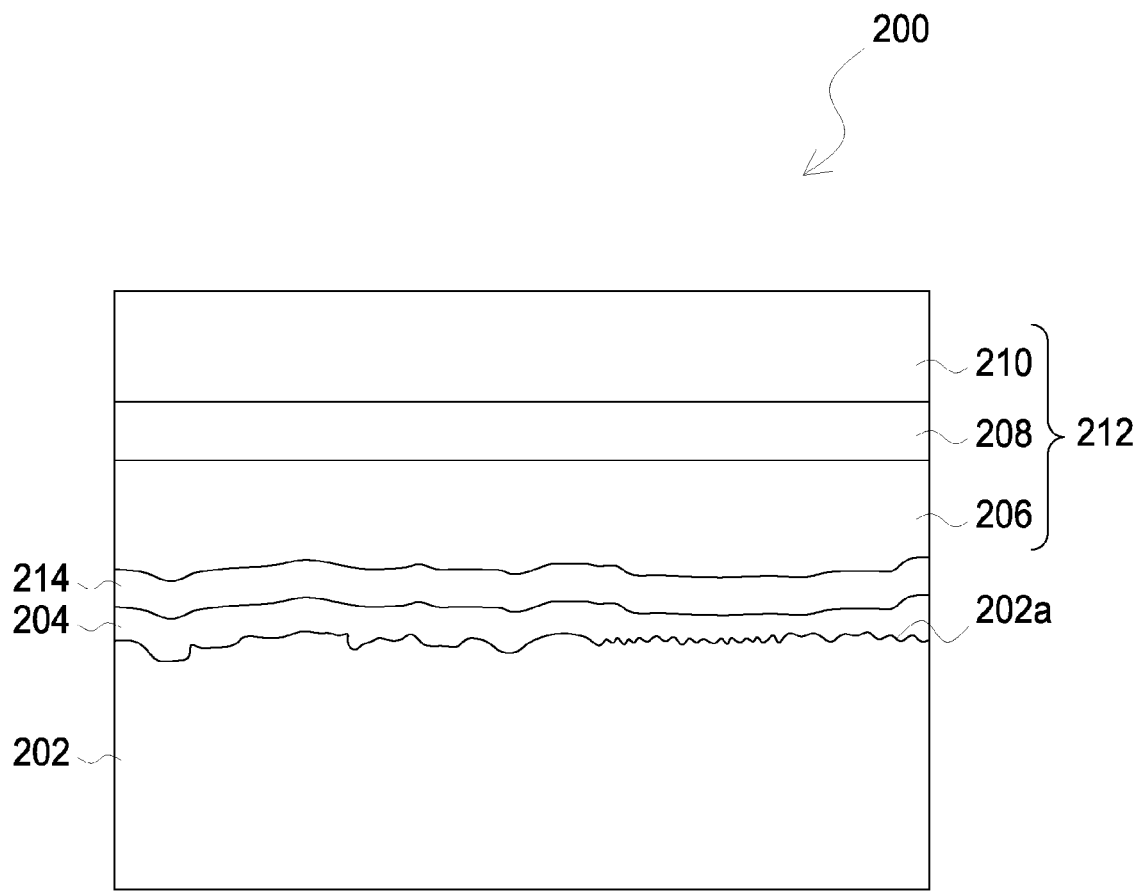
FIG. 2 shows a light-emitting device in accordance with a second embodiment of the present application.

Referring to FIG. 2, a light-emitting device in accordance with a second embodiment of the present application is disclosed. A light-emitting device 200 includes: a single crystalline wafer 202 including an irregularly uneven surface 202a; a first semiconductor buffer layer 204 formed on the single crystalline wafer 202; a second semiconductor buffer layer 214 formed on the first semiconductor buffer layer 204; and a light-emitting stack 212 formed on the second semiconductor buffer layer 214 and including a first semiconductor layer 206 having a first conductivity, an active layer 208, and a second semiconductor layer 210 having a second conductivity. The first semiconductor layer 206 can be grown by a vapor carrying a group IIIA element and group VA element in an MOCVD chamber. The pressure in the MOCVD chamber can be gradually decreasing along with the duration of forming the first semiconductor layer 206, and the ratio of the group IIIA element to the group VA element in the vapor is gradually decreasing along the duration of forming the first semiconductor layer 206, and the temperature can be gradually increasing along with the duration of forming the first semiconductor layer 206. The first semiconductor buffer layer 204 can include an LT (Low Temperature) GaN layer grown under a temperature between 550° C. and 720° C., and a pressure between 70 mbar and 400 mbar in an MOCVD chamber, and the growth rate of the first semiconductor buffer layer 204 is less than 2 μm per hour. The second semiconductor buffer layer 206 can include undoped GaN or un-intentionally doped GaN. The light-emitting stack 212 can receive a forward current, therefore the active layer 208 is activated to emit light, and the light can be reflected by the irregularly uneven surface 202a.

Figure 3:
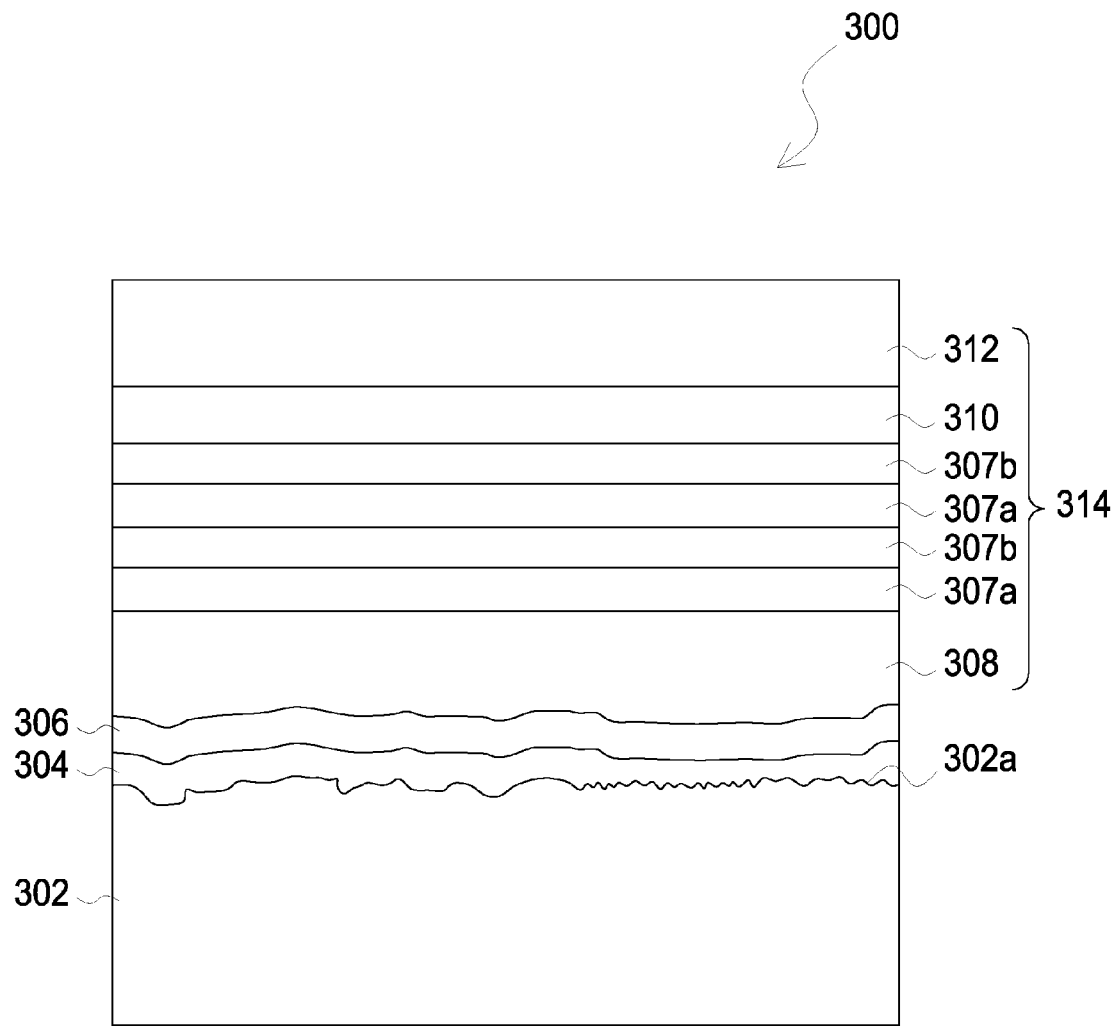
FIG. 3 shows a light-emitting device in accordance with a third embodiment of the present application.

Referring to FIG. 3, a light-emitting device in accordance with a third embodiment of the present application is disclosed. A light-emitting device 300 includes: a single crystalline wafer 302 including an irregularly uneven surface 302a; a first semiconductor buffer layer 304 formed on the single crystalline substrate 302; a second semiconductor buffer layer 306 formed on the first semiconductor buffer layer 304; and a light-emitting stack 312 formed on the second semiconductor buffer layer 306 and including a first semiconductor layer 308 having a first conductivity, an active layer 310, and a second semiconductor layer 312 having a second conductivity. A set of strain-releasing stacked layers 307a, 307b can alternate with each other to form a strain-releasing structure formed between the active layer 310 and the first semiconductor layer 308. The first semiconductor layer 308 can be grown by a vapor carrying a group IIIA element and group VA element in an MOCVD chamber. The pressure in the MOCVD chamber can be gradually decreasing along with the duration of forming the first semiconductor layer 308, and the ratio of the group IIIA element to the group VA element in the vapor is gradually decreasing along with the duration of forming the first semiconductor layer 308, and the temperature can be gradually increasing along with the duration of forming the first semiconductor layer 308. The first semiconductor buffer layer 304 can include an LT (Low Temperature) GaN layer grown under a temperature between 550° C. and 720° C., and a pressure between 70 mbar and 400 mbar in an MOCVD chamber, and the growth rate of the first semiconductor buffer layer 304 is less than 2 μm per hour. The second semiconductor buffer layer 206 can include undoped GaN or un-intentionally doped GaN. The light-emitting stack 314 can receive a forward current, therefore the active layer 310 is activated to emit light, and the light can be reflected by the irregularly uneven surface 302a.

Although the present application has been explained above, it is not the limitation of the range, the sequence in practice, the material in practice, or the method in practice. Any modification or decoration for present application is not detached from the spirit and the range of such.

What is claimed is:

1. A method for manufacturing a light-emitting device, comprising steps of:
   providing an as-cut wafer devoid of a patterning process and having an irregularly uneven surface comprising surface roughness greater than 0.5 μm; and
   forming a light-emitting stack on the irregularly uneven surface of the as-cut wafer by an epitaxial growth method, and the light-emitting stack comprises an upper surface having surface roughness less than 0.2 nm;
   wherein there is no patterning or roughing process after the step of providing the as-cut wafer and before the step of forming the light-emitting stack on the irregularly uneven surface of the as-cut wafer.

2. The method according to claim 1, further comprising forming a first semiconductor buffer layer on the irregularly uneven surface before forming the light-emitting stack.

3. The method according to claim 2, wherein the growth temperature of the first semiconductor buffer layer is between 550° C. and 720° C.

4. The method according to claim 2, wherein the first semiconductor buffer layer is grown under a pressure between 70 mbar and 400 mbar.

5. The method according to claim 2, wherein the growth rate of the first semiconductor buffer layer is less than 2 μm per hour.

6. The method according to claim 2, further comprising forming a second semiconductor buffer layer on the first semiconductor buffer layer before forming the light-emitting stack.

7. The method according to claim 6, wherein the second semiconductor buffer layer comprises undoped GaN or un-intentionally doped GaN, and the first semiconductor buffer layer comprises GaN.

8. The method according to claim 1, wherein the step of forming the light-emitting stack comprises: forming a first semiconductor layer having a first conductivity on the irregularly uneven surface; forming an active layer on the first semiconductor layer; and forming a second semiconductor layer having a second conductivity on the active layer.

9. The method according to claim 8, wherein the first semiconductor layer is grown under a pressure gradually decreasing along the duration of forming the first semiconductor layer and under a temperature gradually increasing along the duration of forming the first semiconductor layer.

10. The method according to claim 8, wherein the first semiconductor layer is grown by a vapor carrying a group IIIA element and group VA element, and the ratio of the group IIIA element to the group VA element in the vapor is gradually decreasing along the duration of forming the first semiconductor layer.

11. The method according to claim 8, further comprising forming a strain-releasing structure between the first semiconductor layer and the active layer.

12. The method according to claim 1, further comprising forming a first semiconductor buffer layer on the irregularly uneven surface before forming the light-emitting stack, with a growth temperature of the first semiconductor buffer layer is between 550° C. and 720° C. and grown under a pressure between 70 mbar and 400 mbar, and a growth rate of the first semiconductor buffer layer is less than 2 µm per hour.

* * * * *